US006570905B1

(12) United States Patent
Ebeling

(10) Patent No.: US 6,570,905 B1
(45) Date of Patent: May 27, 2003

(54) VERTICAL CAVITY SURFACE EMITTING LASER WITH REDUCED PARASITIC CAPACITANCE

(75) Inventor: Karl Joachim Ebeling, Ulm (DE)

(73) Assignee: U-L-M photonics GmbH, Ulm (DE)

( * ) Notice: Subject to any disclaimer, the term of this patent is extended or adjusted under 35 U.S.C. 154(b) by 79 days.

(21) Appl. No.: 09/704,345

(22) Filed: Nov. 2, 2000

(51) Int. Cl.[7] .............................. H01S 5/183; H01S 5/20
(52) U.S. Cl. ........................................... 372/96; 372/46
(58) Field of Search ..................................... 372/46, 96

(56) References Cited

U.S. PATENT DOCUMENTS

| | | | |
|---|---|---|---|
| 5,115,441 A | 5/1992 | Kopf et al. | 372/45 |
| 5,343,487 A | 8/1994 | Scott et al. | 372/46 |
| 5,412,680 A | 5/1995 | Swirhun et al. | 372/45 |
| 5,493,577 A | 2/1996 | Choquette et al. | 372/46 |
| 5,594,751 A | 1/1997 | Scott | 372/46 |
| 5,633,527 A | 5/1997 | Lear | |
| 5,881,085 A * | 3/1999 | Jewell | 372/46 |

FOREIGN PATENT DOCUMENTS

| | | |
|---|---|---|
| EP | 11040546 | 11/1999 |
| JP | 10-157708 | 5/1998 |
| JP | 10-175889 | 6/1998 |
| JP | 11-058850 | 3/1999 |
| WO | 9950939 | 10/1999 |

OTHER PUBLICATIONS

Small and Large Signal Modulation of 850 nm Oxide–Confined Vertical Cavity Surface Emitting Lasers.
Lear et al., 1997, Optical Society of America, OSA TOPS vol. 15 Advances in Vertical Cavity.
High–Speed Characteristics of Low–Optical Loss Oxide–Apertured Vertical–Cavity Lasers.
Thibeault et al., 1997, IEEE, pp. 1041–1137.
Self–Stopping Selective–Oxidation Process of AlAs, Yoshikawa et al.
Applied Physics Letters, vol. 72, No. 18, 1998.
Design and Analysis of Single–Mode Oxidized VCSEL's for High–Speed Optical Interconnects.
Wiedenmann et al., 1999, IEEE, pp. 1077–260X.

* cited by examiner

Primary Examiner—James W. Davie
(74) Attorney, Agent, or Firm—Volpe and Koenig, P.C.

(57) ABSTRACT

An oxide-confined vertical cavity surface emitting laser having reduced parasitic capacitance. The VCSEL includes a substrate having a first mirror stack grown epitaxially thereon. The first mirror stack includes a plurality of semiconductor layers and is doped with a first doping type. An active region is grown epitaxially above the first mirror stack for generating a lasing emission. A control layer is grown epitaxially above the first mirror stack, between first mirror stack and the active region or above the active region, and includes a central non-oxidized conducting portion and an outer, laterally oxidized insulating portion. A second mirror stack is grown epitaxially above the active region and the control layer. The second mirror stack includes a second plurality of semiconductor layers doped with a second doping type. The second plurality of semiconductors layers includes pairs of high index and low index materials. The low index material layers are generally equally laterally oxidized and have a non-oxidized central portion. The penetration of the lateral oxidation of the low index material layers is less than the oxidation penetration for the outer laterally oxidized insulating portion of the control layer.

10 Claims, 3 Drawing Sheets light output light output

VERTICAL CAVITY SURFACE EMITTING LASER WITH REDUCED PARASITIC CAPACITANCE

BACKGROUND

The present invention relates to vertical cavity surface emitting lasers, (VCSEL's), and more particularly to VCSEL's having a thin oxidized aperture for carrier confinement.

VCSEL's are regarded as key enabling technology for low-cost broad-band optical interconnects. With single devices, bit rates of over 10 Gb/s have already been demonstrated for transmission distances of up to 100 meters of multi-mode fiber point-to-point interconnects. Rapidly increasing clock speeds and input/output requirements, parallel processing architectures, and the growth of global communication networks are the driving force behind increasing both the speed, power and available bandwidth of VCSEL's.

VCSEL's typically are formed from a bottom electrode, a semiconductor substrate, bottom and top mirror stacks with an active region and a confining control layer located therebetween, and a centrally located window over the top mirror stack, for example as disclosed in U.S. Pat. No. 5,493,577. Typically the substrate and bottom mirror stack are doped with a first doping type, such as an n-dopant, and the second mirror stack is doped with a second doping type, such as a p-dopant. The bottom and top mirror stacks are typically formed as distributed Bragg reflectors (DBR's), with each mirror stack having a number of pairs (or periods) of high index and low index semiconductor materials, typically ranging from 10–40 mirror periods. The active region is a region in which electrons (−) and holes (+) recombine providing, under proper stimulation, a laser emission. The active region may be formed as a multi-quantum well (MQW) structure with very thin barriers.

It has also been known to form one or more control layers in proximity to the active region from an oxidized semiconductor layer having a non-oxidized central portion.

However, a draw back of the known devices is the reduced modulation efficiency and limitations on bandwidth caused by the high device capacitance due to the use of the thin oxide control layer. This is discussed in several references including Thibeault et al., I.E.E.E. Phototonics Technology Letters, Vol. 9, No. 1, January 1997 (pp. 11–13); Wiedenmann et al., I.E.E.E., Journal of Selected Topics in Quantum Electronics, Vol. 5, No. 3, May/June 1999 and Lear et al., Optical Society of Amaerica Tops, Vol. 15, 1997 (pp. 69–74). One solution to this problem proposed by Lear et al. is to utilize ion bombardment or implantation to create an annular low capacity region above the current aperture. The solution proposed by Thibeault et al. is to utilize a thicker oxide layer which tapers down in the lens area to keep the optical loss to a minimum. Both of these known solutions present additional processing time and/or higher costs. A third solution is proposed by Wiedenmann et al. on p. 504: "Small-diameter mesa with steep sidewalls are required to obtain a low oxide capacitance". The third solution also presents higher costs because dry etching, and not wet etching, has to be used to obtain the steep sidewalls, and it presents higher optical loss because of light scattering on the etched sidewalls.

Accordingly, it would be desirable to reduce the high device capacitance in the above-noted type of VCSEL in order to obtain a greater bandwidth.

SUMMARY

Briefly stated, the present invention provides an oxide-confined vertical cavity surface emitting laser having reduced parasitic capacitance. The VCSEL includes a substrate having a first mirror stack grown epitaxially thereon. The first mirror stack includes a plurality of semiconductor layers and is doped with a first doping type. An active region is grown epitaxially above the first mirror stack for generating a lasing emission. A control layer is grown epitaxially above the first mirror stack, between the first mirror stack and the active region or above the active region, and includes a central, non-oxidized conducting portion and an outer, laterally oxidized insulating portion. A second mirror stack is grown epitaxially above the active region and the control layer. The second mirror stack includes a second plurality of semiconductor layers doped with a second doping type. The second plurality of semiconductors layers includes pairs of high index and low index materials. The low index material layers are generally equally laterally oxidized and have a non-oxidized central portion. The penetration of the lateral oxidation of the low index material layers is less than the oxidation penetration for the outer laterally oxidized insulating portion of the control layer.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings an embodiment which is presently preferred. It should be understood, however, that the invention is not limited to the precise arrangements and instrumentalities shown. In the drawings.

DETAILED DESCRIPTION OF THE PREFERRED EMBODIMENT

Figure 1:
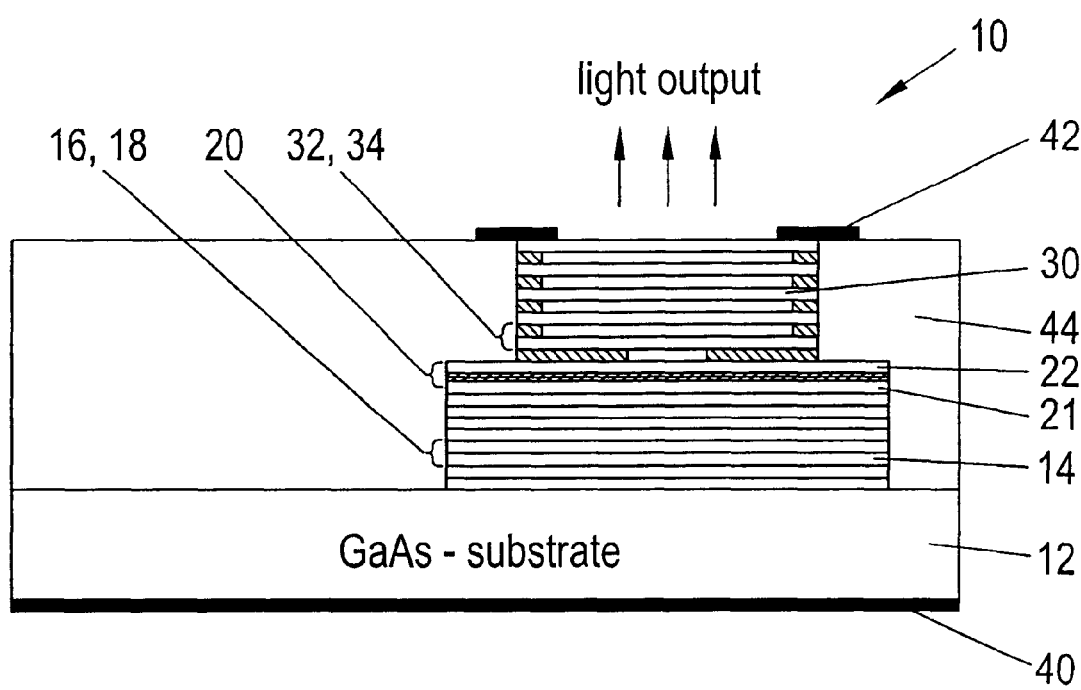
FIG. 1 is a greatly enlarged cross-sectional view of a VCSEL in accordance with the present invention.

Referring now to FIG. 1, a VCSEL 10 in accordance with a preferred embodiment of the present invention is shown. The VCSEL 10 is a layered structure grown epitaxially from semiconductor layers formed on a semiconductor substrate 12. A first mirror stack 14 is grown epitaxially on the substrate 12 and includes a plurality of semiconductor layers 16, 18. The first mirror stack 14 is preferably formed by pairs of high index and low index material layers 18, 16, respectively, and is doped with a first doping type. An active region 20 is grown epitaxially on the first mirror stack 14 for generating a lasing emission. A control layer 22 is preferably epitaxially grown on the active region. While it is preferred that the control layer 22 be located on the upper side of the active region 20, those skilled in the art will recognize that the control region can be located on the lower side of the active region 20 or on both sides of the active region 20, depending upon the VCSEL structure formed, and that such rearrangement would be within the scope and spirit of the present invention. Typically, the control region is placed in the p-doped mirror.

Figure 4:
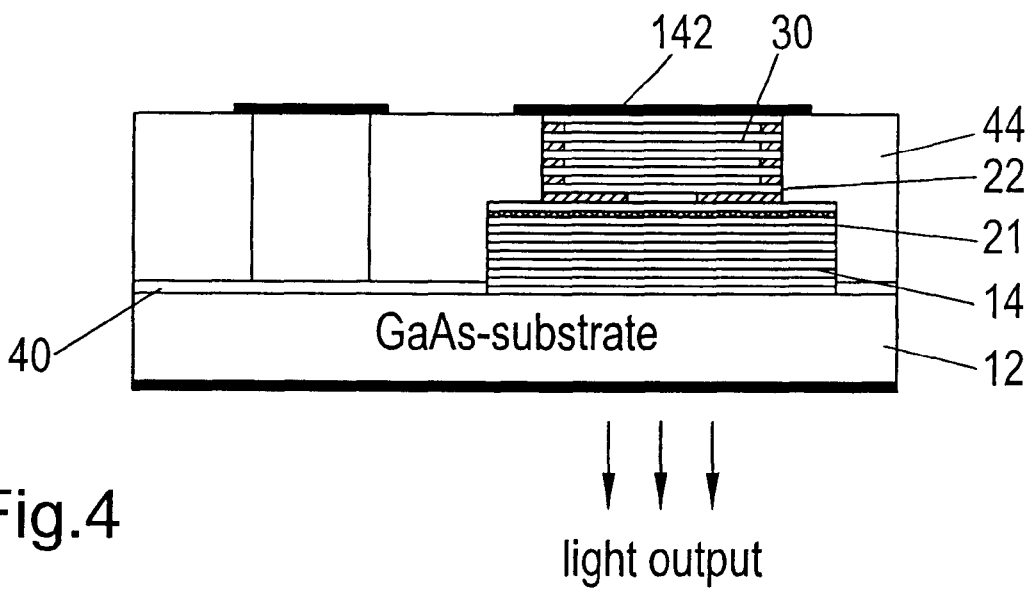
FIG. 4 is a greatly enlarged cross-sectional view of a third embodiment of a VCSEL in accordance with the present invention.

A second mirror stack 30 is grown epitaxially on the control layer 22 above the active region 20 and the first mirror stack 14. The second mirror stack 30 is preferably formed into a mesa and includes a second plurality of semiconductor layers 32, 34 doped with a second doping type. The second plurality of semiconductor layers include pairs of high index and low index material layers 34, 32, respectively. A bottom electrode 40 is in touch with the substrate 12 and a top electrode 42 is located on the second mirror stack 30. The bottom electrode 40 may be beneath the substrate 12, as shown, or may be located on the substrate 12, for example, as shown in the embodiment of FIG. 4, in which the electrical contacts are on the epitaxial side, and light is emitted through the substrate side of the device.

An insulation layer 44 may be provided to protect the mesa and to provide support for the upper electrode 42, metal pads, bond pads or solder pads.

The VCSEL 10 according to the present invention may be formed from III-V; III-IV-V or II-VI compound semiconductor materials. The semiconductor substrate 12 is preferably gallium arsenide (GaAs) and maybe doped, for example, with an n-type doping.

Figure 2:
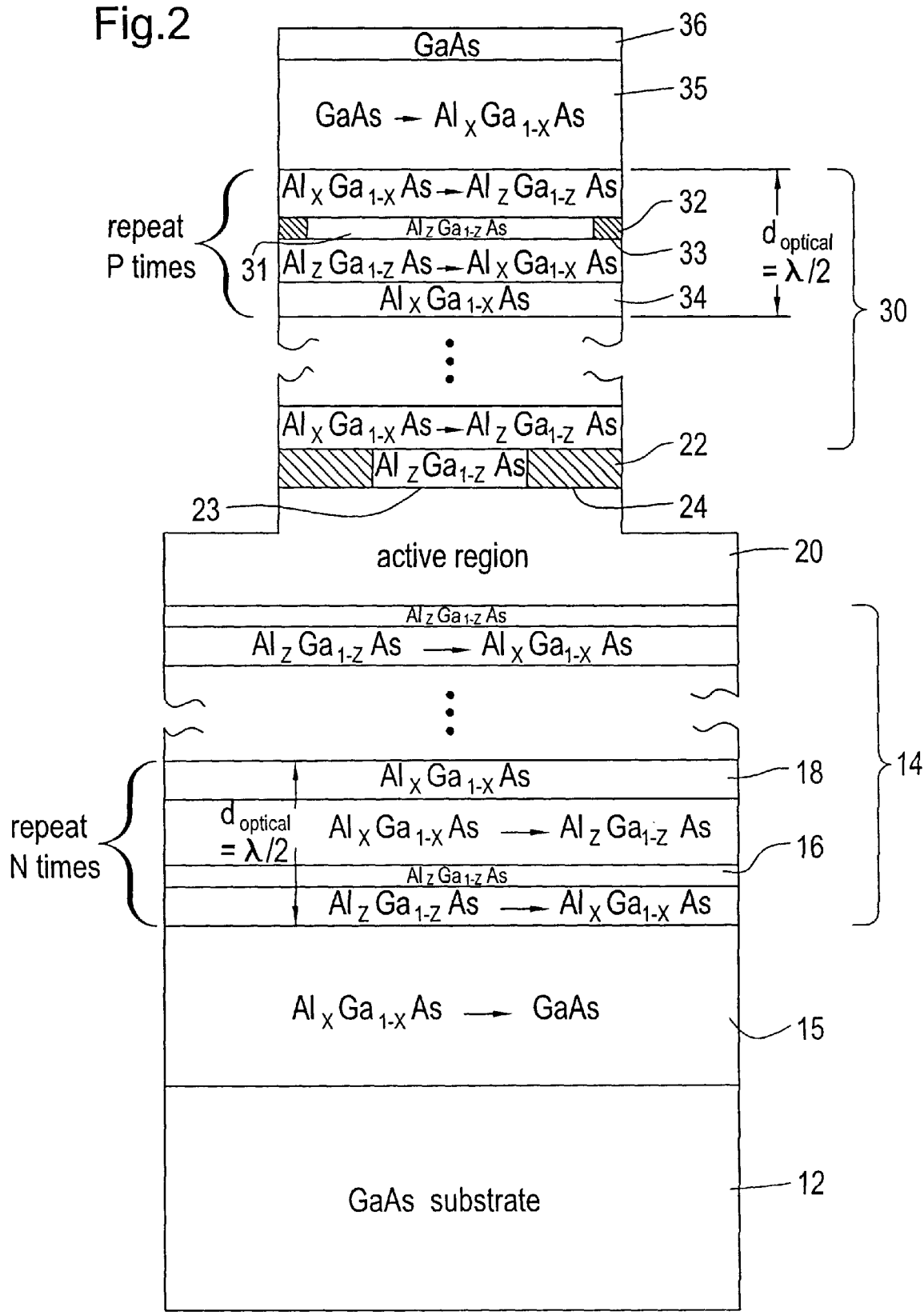
FIG. 2 is a greatly enlarged cross-sectional view similar to FIG. 1 showing the preferred construction of the VCSEL of FIG. 1.

Referring now to FIG. 2, the first mirror stack 14 is preferably grown on the substrate 12 by molecular beam epitaxy (MBE) or by metal-organic chemical vapor deposition, and includes a first doping type that is preferably the same as the substrate 12. A transition layer 15 may be formed between the substrate 12 and the first mirror stack 14. The pairs of high index and low index material layers 18, 16, respectively, in the first mirror stack 14 form the bottom distributed Bragg reflector. In order to minimize voltage drop across the first mirror stack 14, it is epitaxially grown with a smooth periodic continuous or step-graded alloy composition grading and modulated doping concentration to eliminate or reduce any heterojunction potential energy barriers that may otherwise be present between the high index and low index semiconductor layers 18, 16. Preferably, the optical length of each period of the first mirror stack 14 is equal to one-half a wave length of the emitted light. In the preferred embodiment, the high index material 18 comprises $Al_xGa_{1-x}As$, where X is in the range of about 0 to 0.5. The low index material 16 comprises $Al_zGa_{1-z}As$. In the preferred embodiment, Z is preferably in the range of 0.9 to 1.0, and most preferably 1.0. The first mirror stack has a total of N periods, with N preferably being in the range of 15–50, where N is not required to be an integer. Preferably, the each period has a thickness d equal to $\lambda/2n$ on the order of 120–220 nm, where $\lambda$ is the emission wavelength measured in a vacuum and n is the mean value of the refractive index averaged over one period. $d_{optical}$ is therefore equal to $\lambda/2$, because $d_{optical}=n*d$.

Still with reference to FIG. 2, the inner cavity is epitaxially grown on the first mirror stack 14. The active region 20 is preferably formed as a MQW structure with three strained or unstrained quantum well (QW) layers 21 embedded in thin barrier layers. A quantum-well layer is defined as a semiconductor layer providing a quantum confinement of electrons and holes therein, and also includes semiconductor layers comprising a plurality of quantum wires or quantum dots therein. Cladding regions may be utilized to match up to the desired, e.g. $1\lambda$, inner cavity length and to confine electrons and holes in the longitudinal direction.

Still with reference to FIG. 2, the control layer 22 is epitaxially grown on the active region 20. The control layer 22 is preferably formed with $Al_zGa_{1-z}As$, and is p-doped. In a preferred embodiment, Z is in the range of about 0.9 to 1.0, and most preferably equals 1.0. As explained in detail below, the control layer 22 includes a central, non-oxidized conducting portion 23 and an outer, laterally oxidized insulating portion 24. This laterally oxidized outer insulating portion 24 is preferably comprised of $Al_zGa_{1-z}O_y$, and is formed by laterally oxidizing the control layer 22. The extent of the lateral oxidation is controllable as a function of the thickness of the control layer 22 and the oxidation time.

The second mirror stack 30 is epitaxially grown on the control layer 22. The second mirror stack 30 is formed in a similar manner to the first mirror stack 14, and is doped with a second type of doping. Preferably, second mirror stack 30 is p-doped and is also epitaxially grown with a smooth periodic continuous or step-graded alloy composition grading and modulated doping concentration to eliminate or reduce any heterojunction potential energy barriers that may otherwise be present between the high and low index layers 34, 32. A transition layer 35 is epitaxially grown on top of the final mirror of the second mirror stack 30. The transition layer 35 serves to control whether there is a node or antinode of the standing wave pattern at the GaAs/air interface. A final layer of gallium arsenide 36 is grown on top of the transition layer 35. The final layer 36 is highly doped in order to enable low resistance ohmic metal-semiconductor contact.

Figure 3:
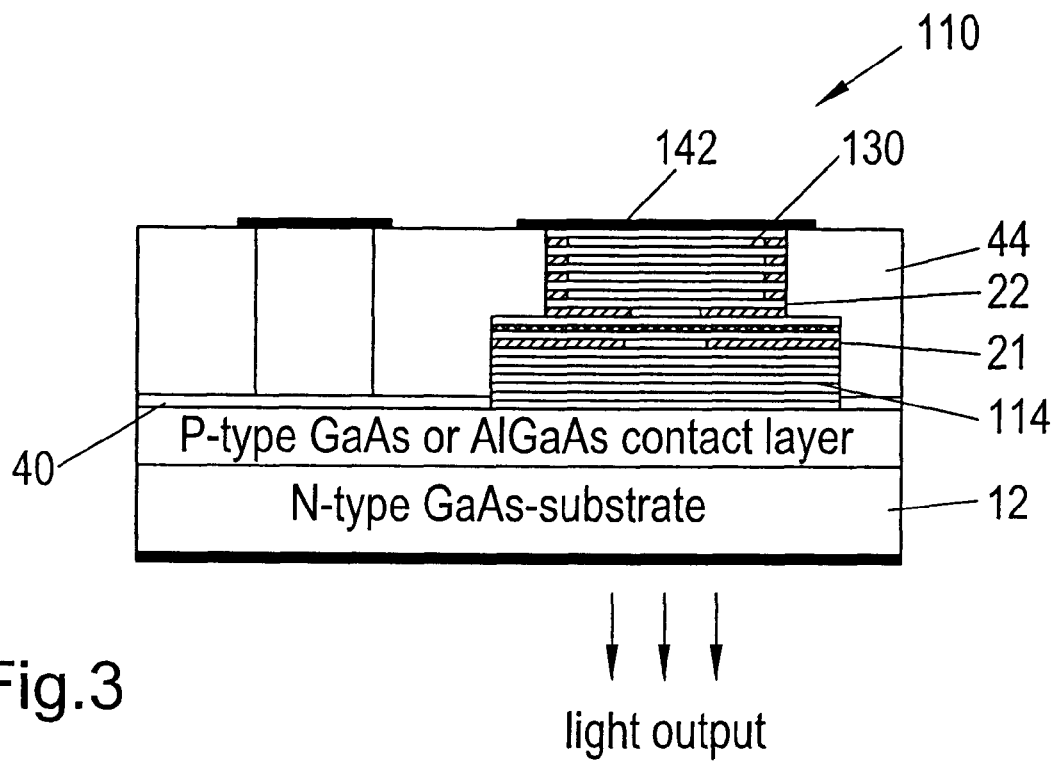
FIG. 3 is a greatly enlarged cross-sectional view of a second embodiment of a VCSEL in accordance with the present invention.

While the arrangement described above is preferred, it will be recognized by those skilled in the art from the present disclosure that an inverted VCSEL structure 110 could be formed, as shown in FIG. 3, in which the first mirror stack 114 is p-doped and the second mirror stack 130 is n-doped. This structure could be useful in forming a bottom output VCSEL in which the mirrors are located on either side of a p-i-n active region.

Referring again to FIGS. 1 and 2, the second mirror stack 34 is formed into a mesa by known means, such as lithographically patterning the top surface of the second mirror stack 30 with an etch mask and etching the mesa structure down to the active region 20 or even down into the first mirror stack 14. The exposed edges of the control layer 22 and the high and low index layers 34, 32 of the second mirror stack 30 at the sides of the mesa are then oxidized in order to form the outer, laterally oxidized insulating portion 24 of the control layer 22. At the same time, the low index material layers 32 of the second mirror stack 30 are also laterally oxidized to form a laterally oxidized outer portion 33 and a non-oxidized central portion 31. The penetration of the laterally oxidized outer portion 33 of the low index material layers 32 is less than the oxidation penetration for the outer, laterally oxidized insulating portion 24 of the control layer 22. This is preferably achieved by controlling the thickness of the low index layers 32, which preferably have a thickness of 15 nm as compared to the thickness of the control layer 22, which preferably has a thickness of 30 nm. While FIG. 2 illustrates the extent of the laterally oxidized outer portion 33 of the low index layer 32, those skilled in the art will recognize that there will also be lateral oxidation of the continuous alloy composition grading between the low index layer 32 and the high index layers 34 of each mirror period.

Referring again to FIG. 1, a filling material 44, such as a polyimide or other insulating resin or polymeric material is used around the mesa region prior to the formation of the upper electrode 42. Preferably, the upper electrode 42 includes an: aperture for light emission for a top-emitting VCSEL, whereas a bottom-emitting VCSEL uses an area wide electrode 142 as shown in FIGS. 3 and 4.

Electrically, the laterally oxidized portions 33 of the low index layers 32 of the second mirror stack 30 are connected in series with the outer, laterally oxidized insulating portion 24 of the control layer 22. This reduces the overall device capacitance of the VCSEL structure 10, providing a greater modulation bandwidth than was previously attainable due to the reduction in parasitic capacitance. For example, a VCSEL 10 in accordance with the present invention may have a bandwidth in the range 16 GHz, in comparison to the prior known devices which had a bandwidth which was limited to about 8 GHz.

An additional advantage of the present invention over the prior known devices is the use of thin low index layers 32 in the second mirror stack 30 having a thickness of 15 nm. This reduces the internal stress in the VCSEL 10 due to the layer thickness change caused by oxidation when the outer portions are laterally oxidized. Since the layers 32 are initially very thin, the percentage change in thickness due to oxidation remains small, inducing less internal stress.

While the present invention has been described in terms of a preferred embodiment, those skilled in the art will recognize that other modifications are within the spirit and scope of the present invention. Accordingly, it will be appreciated by those skilled in the art that changes can be made to the embodiment described above without departing from the broad inventive concept thereof. It is understood, therefore, that the invention is not limited to the particular embodiment disclosed and is intended to cover modifications within the scope and spirit of the present invention as defined by the appended claims.

What is claimed is:

1. An oxide-confined vertical cavity surface emitting laser having reduced parasitic capacitance, comprising:
    a substrate;
    a first mirror stack grown epitaxially on the substrate, the first mirror stack including a plurality of semiconductor layers and being doped with a first doping type;
    an active region grown epitaxially above the first mirror stack for generating a lasing emission;
    a control layer grown epitaxially above the first mirror stack, between the first mirror stack and the active region or above the active region, and having a central non-oxidized conducting portion and an outer, laterally oxidized insulating portion; and
    a second mirror stack grown epitaxially above the control layer and the active region, the second mirror stack forming a mesa and including a second plurality of semiconductor layers doped with a second doping type, the second plurality of semiconductor layers including pairs of high index and low index material layers, the low index material layers being generally equally laterally oxidized and having a non-oxidized central portion, the penetration of the lateral oxidation of the low index material layers being less than oxidation penetration for the outer, laterally oxidized insulating portion of the control layer.

2. The vertical cavity surface emitting laser of claim 1, wherein the low index layers of the second mirror stack are comprised of $Al_zGa_{1-z}As$ and $Al_zGa_{1-z}O_y$.

3. The vertical cavity surface emitting laser of claim 2, wherein Z is in the range of 0.9 to 1.0.

4. The vertical cavity surface emitting laser of claim 2, wherein the high index layers of the second mirror stack are comprised of $Al_xGa_{1-x}As$.

5. The vertical cavity surface emitting laser of claim 4, wherein X is in the range of 0 to 0.5.

6. The vertical cavity surface emitting laser of claim 4, wherein the composition of the layers of the second mirror stack continuously vary between the high index and low index materials.

7. The vertical cavity surface emitting laser of claim 1, wherein the overall capacitance of the laser is reduced due to the laterally oxidized portion of the low index material layers.

8. The vertical cavity surface emitting laser of claim 1, wherein the first and second mirror stacks each comprise high contrast electrically conductive distributed Bragg reflectors having a high refractive index variation within each mirror period.

9. The vertical cavity surface emitting laser of claim 1, wherein the first mirror stack includes pairs of high index and low index material layers, the low index material layers of the first mirror stack, the central non-oxidized portion of the low index material layers of the second mirror stack, and the central non-oxidized conducting portion of the control layer having the same material composition.

10. The vertical cavity surface emitting laser of claim 9, wherein the material composition consists essentially of $Al_zGa_{1-z}As$.

* * * * *